US011354480B1

(12) United States Patent
Eaton et al.

(10) Patent No.: US 11,354,480 B1
(45) Date of Patent: Jun. 7, 2022

(54) DETERMINING CLOCK GATES FOR DECLONING BASED ON SIMULATION AND SATISFIABILITY SOLVER

(71) Applicant: Cadence Design Systems, Inc., San Jose, CA (US)

(72) Inventors: Matthew David Eaton, Stow-cum-Quy (GB); Ji Xu, Cambridge (GB); George Simon Taylor, Round Rock, TX (US); Zhuo Li, Austin, TX (US)

(73) Assignee: Cadence Design Systems, Ine., San Jose, CA (US)

( * ) Notice: Subject to any disclaimer, the term of this patent is extended or adjusted under 35 U.S.C. 154(b) by 0 days.

(21) Appl. No.: 17/360,782

(22) Filed: Jun. 28, 2021

Related U.S. Application Data

(60) Provisional application No. 63/202,171, filed on May 28, 2021.

(51) Int. Cl.
  *G06F 30/396* (2020.01)
  *G06F 30/3308* (2020.01)
  *G06F 30/3312* (2020.01)
  *G06F 30/3323* (2020.01)
  *G06F 30/367* (2020.01)
  *G06F 30/398* (2020.01)

(52) U.S. Cl.
  CPC ........ *G06F 30/396* (2020.01); *G06F 30/3308* (2020.01); *G06F 30/3312* (2020.01); *G06F 30/3323* (2020.01); *G06F 30/367* (2020.01); *G06F 30/398* (2020.01)

(58) Field of Classification Search
  CPC .............. G06F 30/396; G06F 30/3308; G06F 30/3312; G06F 30/3323; G06F 30/367; G06F 30/398

USPC ..... 716/111, 113, 108, 136, 122; 703/16, 19
See application file for complete search history.

(56) References Cited

U.S. PATENT DOCUMENTS

| 7,289,946 | B1 * | 10/2007 | Lee ................ | G01R 31/318563 |
| | | | | 714/724 |
| 9,135,375 | B1 * | 9/2015 | Sood ....................... | G06F 30/00 |
| 2008/0072197 | A1 * | 3/2008 | Ja ........................ | G06F 30/3312 |
| | | | | 716/108 |

FOREIGN PATENT DOCUMENTS

EP           3657363 A1 *   5/2020

OTHER PUBLICATIONS

Nb9406411, "Automated Simulation Method for VLSI Designs", IBM Technical Disclosure Bulletin, published Jan. 6, 1994. (Year: 1994).*

* cited by examiner

*Primary Examiner* — Phallaka Kik
(74) *Attorney, Agent, or Firm* — Schwegman Lundberg & Woessner, P.A.

(57) ABSTRACT

Various embodiments provide for determining clock gates for decloning based on simulation and a satisfiability solver, which can be part of electronic design automation (EDA). In particular, some embodiments use a simulation process to quickly determine whether enable signals associated with two clock gates are logically equivalent using a random input vector to a circuit design and, if logically equivalent by the simulation process, use a satisfiability solver to determine a variable assignment (e.g., at least one vector) such that the enable signals are found to be non-equivalent.

20 Claims, 7 Drawing Sheets

DETERMINING CLOCK GATES FOR DECLONING BASED ON SIMULATION AND SATISFIABILITY SOLVER

CLAIM OF PRIORITY

This application claims the benefit of priority under 35 U.S.C. § 119(e) to U.S. Provisional Patent Application Ser. No. 63/202,171, filed on May 28, 2021, which is incorporated by reference herein in its entirety.

TECHNICAL FIELD

Embodiments described herein relate to circuit design and, more particularly, to systems, methods, devices, and instructions for determining clock gates for decloning based on (e.g., using) simulation and a satisfiability solver, which can be part of electronic design automation (EDA).

BACKGROUND

As a part of designing a circuit, such as an integrated circuit (IC), an electronic design automation (EDA) software system commonly performs generation of a clock distribution network (also referred to as a clock tree), which uses a branching network to distribute a clock signal from a clock signal source to a plurality of clocked circuit elements (or clock sinks) within a circuit design. The clocked circuit elements usually comprise circuit devices in the circuit design that are designed to be clocked and thus need a clock signal to operate. Examples of clocked circuit elements include flip-flops or other sequential circuit devices that rely on a clock signal to synchronize their operations. A clocked circuit element can receive a clock signal via a clock pin included by the clocked circuit element.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
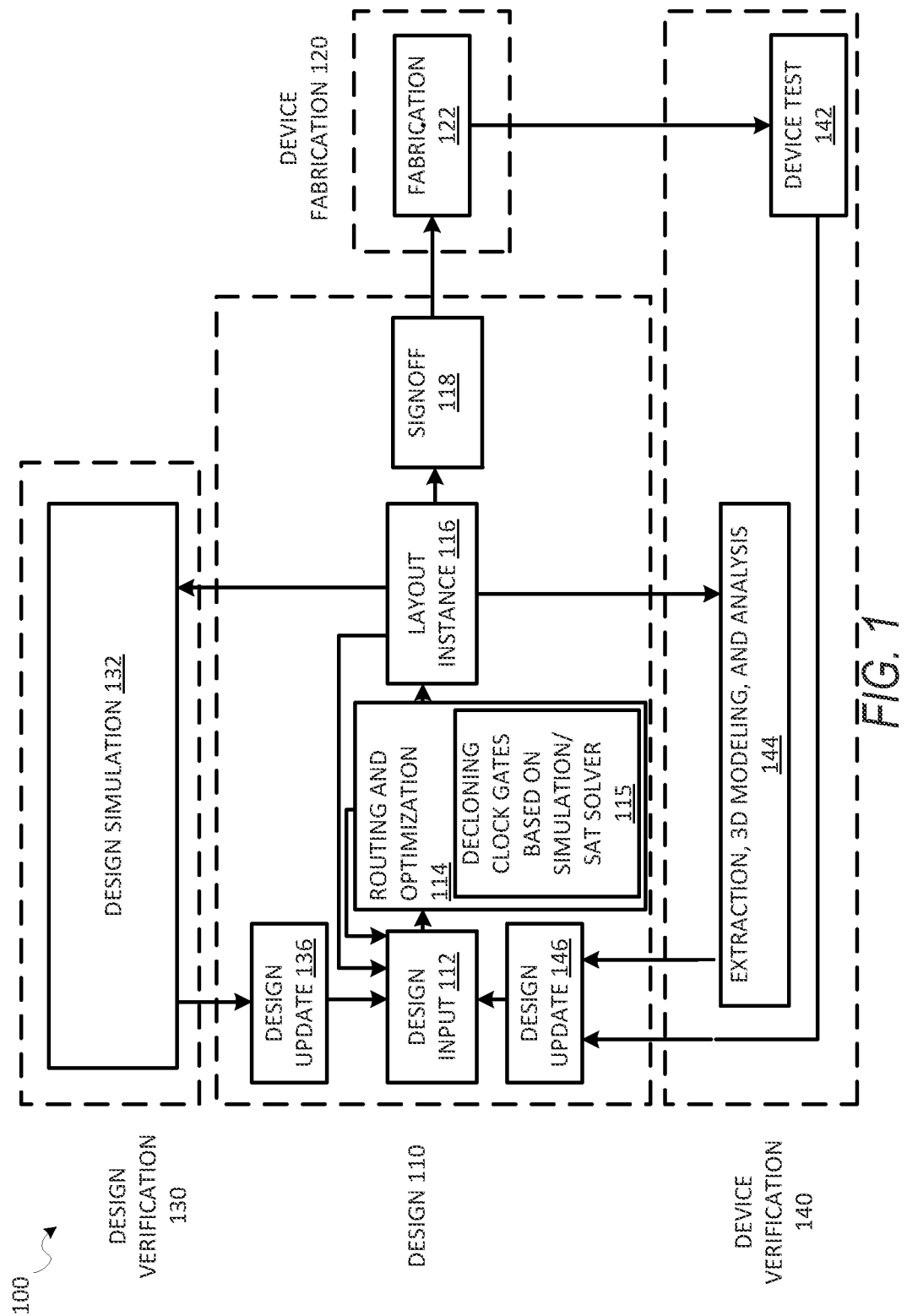
FIG. 1 is a diagram illustrating an example design process flow for determining clock gates for decloning based on simulation and a satisfiability solver, according to some embodiments.

Various embodiments provide for determining (e.g., identifying) clock gates for decloning based on (e.g., using) simulation and a satisfiability solver, which can be part of electronic design automation (EDA). In particular, the methodologies described herein can use a simulation process to quickly determine whether enable signals (e.g., two enable signals associated with two clock gates) are logically non-equivalent using a random input vector to a circuit design (e.g., simulating over N number of iterations where a different random input vector is used for each iteration) and, if found to be logically equivalent by the simulation process, use a satisfiability solver to determine (e.g., find or identify) a variable assignment (e.g., at least one vector) such that the enable signals (e.g., two enable signals) are found to be non-equivalent.

Generally, nodes of a clock network can comprise a clock-gate or integrated clock gate (ICG), in the path from a clock source to a clock pin of a circuit element, to turn off a cluster of clock pins (also referred to as an ICG group) if the cluster is not required for certain operations of the final circuit for the active operation of the IC. In this way, the ICG can permit the final circuit to save power that would otherwise be consumed by the cluster had it not been gated from the clock tap by the ICG.

While clock gates can reduce power in a circuit design (e.g., integrated circuit (IC)), each clock gate added to a circuit design also involves a cost, as clock gates usually have leakage power and internal power usage. Additionally, duplicate clock gates can fragment a clock network (e.g., clock tree), and increase gated and ungated clock wire capacitance. As a result, clock gate decloning is commonly used to merge clock gates that have a similar enable condition, thereby reducing power in a clock network (of a circuit design), reducing clock gate area, and reducing leakage power, while gating more of the clock network. Traditional clock gate decloning examines two levels of logic that controls enabling (and disabling) of two or more clock gates and merges the two or more clock gates in response to determining that the examined logic is structurally similar and driven by the same signals. Unfortunately, this can lead to many duplicate clock gates where enable logic is not contained wholly within a module boundary or the logic is differently structured.

Various embodiments described herein can enable or facilitate clock gate decloning that merges clock gates that are logically equivalent but not necessarily structurally the same. According to some embodiments, a simulation process and a satisfiability solver (or sat solver) are used to determine (e.g., check) whether enable signals (e.g., two enable signals) of different clock gates (e.g., two different clock gates) are logically equivalent. Specifically, some embodiments use a simulation process to quickly determine whether enable signals (e.g., two enable signals associated with two clock gates) are logically non-equivalent using a random input vector to a circuit design (e.g., simulating over N number of iterations where a different random input vector is used for each iteration). If any of the random input vectors lead to the enable signals being proven to not be equivalent, then the enable signals can be determined to be not equivalent, and the associated clock gates cannot be merged. However, if all of the random input vectors indicate that the enable signals are equivalent, some embodiments then use a sat solver to determine (e.g., find or identify) a variable assignment (e.g., at least one vector) such that the enable signals (e.g., two enable signals) are found to be non-equivalent. If the sat solver determines (e.g., conclusively proves) that the variable assignment does not exist, the enable signals (e.g., two enable signals) are determined to be logically equivalent. In this way, the sat solver can find that the simulation's determination (that the enable signals are logically equivalent) is incorrect. Where the logical equivalency of the enable signals is confirmed by the sat solver, the associated clock gates associated with the two enable signals can be merged during a decloning process.

To address or avoid situations where using a simulation process can result in poor discrimination/partitioning, some embodiments can use a combination of simulation and sat solver problems to speed up convergence by choosing one or more vectors for the simulation, where the vectors are derived from solutions generated by the sat solver for a small number of sat solver problems. By use of various embodiments, clock gates having similar or duplicate enable signals (e.g., similar/duplicate enable logic cones) can be determined (e.g., identified) and subsequently decloned by a clock gate decloning process.

As used herein, an enable signal can be coupled to an input (e.g., pin) of a clock gate that controls whether the clock gate is enabled or disabled. For some embodiments, when a given clock gate is enabled, a cluster of circuit elements coupled to the clock gate receive a clock signal via the given clock gate. When a given clock gate is disabled, a cluster of circuit elements coupled to the clock gate does not receive a clock signal via the given clock gate.

As used herein, a satisfiability solver (or sat solver) can comprise a Boolean satisfiability solver, such as one part of a SimSat solver. In general, a sat solver can prove conclusively if a logic proposition is satisfiable, where with a suitable choice of proposition, one can determine with mathematical certainty that enable signals are logically equivalent.

As used herein, decloning two or more clock gates of a circuit design comprises modifying the circuit design such that one clock gate can replace the two or more clock gates in the circuit design and can gate the clusters of clock pins previously controlled by the two or more clock gates. By replacing the two or more clock gates with the one clock gate, the decloning process can effectively merge the two or more clock gates into the one clock gate.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for determining (e.g., identifying) clock gates for decloning based on (e.g., using) simulation and a satisfiability solver, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. As shown, the routing and optimization 114 operation includes a decloning clock gates based on simulation or satisfiability solver 115 operation (hereafter, decloning clock gates based on simulation/satisfiability solver 115 operation), which may be performed in accordance with various embodiments described herein. Though illustrated with respect to the routing and optimization 114 operation, for some embodiments, the decloning clock gates based on simulation/satisfiability solver 115 can be performed much earlier (or later) than the routing and optimization 114 operation. The decloning clock gates based on simulation/satisfiability solver 115 operation can determine (e.g., identify) clock gates for decloning based on (e.g., using) simulation and a satisfiability solver as described herein.

While the design process flow 100 shows optimization occurring prior to a layout instance 116, routing, timing analysis and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118, as described below.

After design inputs are used in the design input 112 operation to generate a circuit layout, and any of the routing and optimization 114 operations are performed, a layout is generated in the layout instance 116. The layout describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

FIGS. 2 through 5 are flowcharts illustrating example methods for determining (e.g., identifying) clock gates for decloning based on (e.g., using) simulation and a satisfiability solver, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a hardware processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Figure 2:
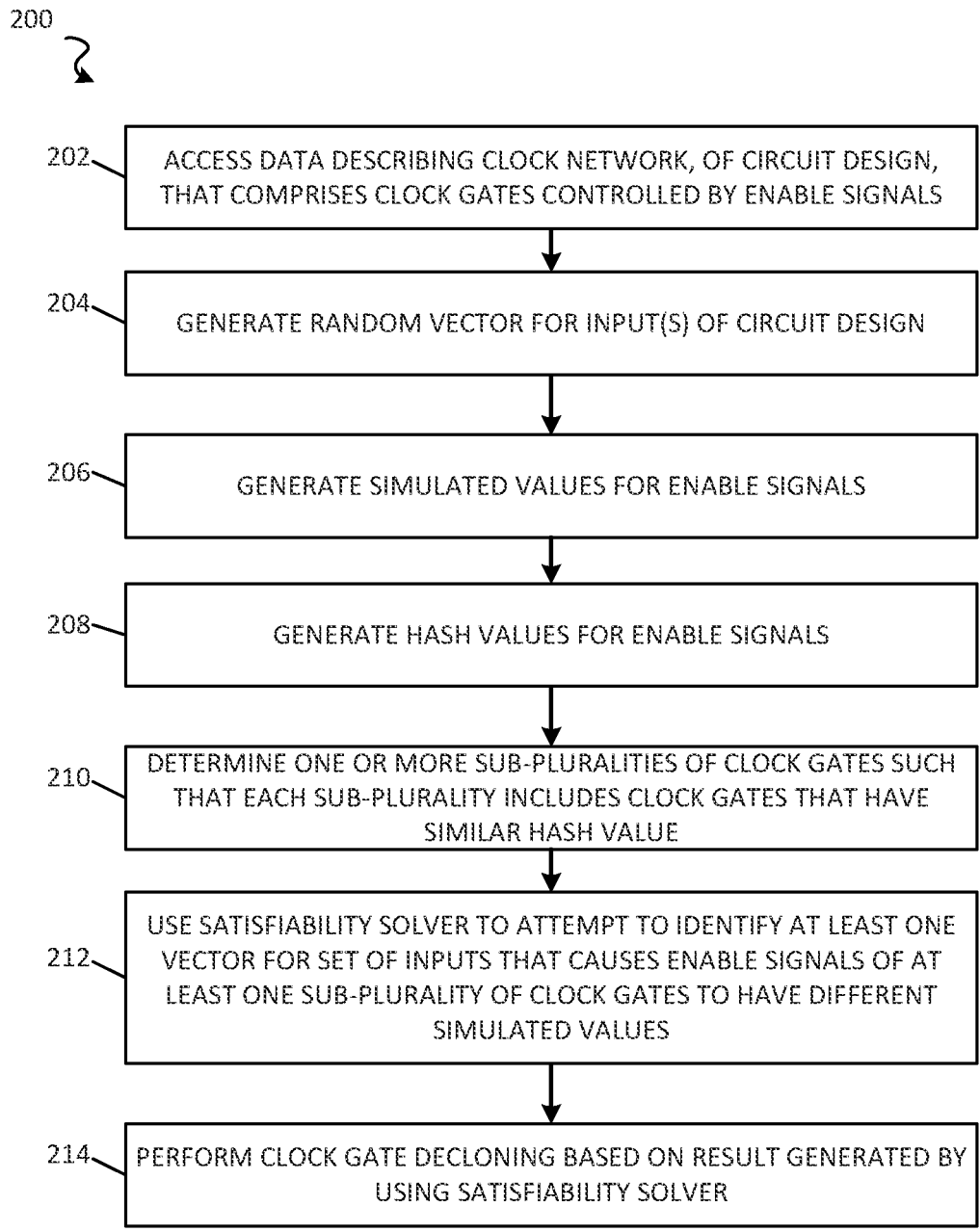
FIGS. 2 through 5 are flowcharts illustrating example methods for determining clock gates for decloning based on simulation and a satisfiability solver, according to some embodiments.

Referring now to FIG. 2, the flowchart illustrates the example method 200 for determining clock gates for decloning based on simulation and a satisfiability solver, according to some embodiments. Operation 202 accesses data that describes a clock network of a circuit design, where the clock network comprises a plurality of clock gates controlled by a corresponding plurality of enable signals (e.g., an individual enable signal enabling or disabling an individual clock gate). A clocked circuit element, such as a flip-flop, is coupled to the clock network of the circuit design. At operation 204, a random vector is generated for a set of inputs (e.g., primary inputs) of the circuit design. Thereafter, at operation 206, a plurality of simulated values is generated for the corresponding plurality of enable signals by simulating operation of the clock network (e.g., via simulation of the circuit design) using the random vector. For some embodiments, operation 206 uses a simulation processes (e.g., one part of a SimSat) to simulate the circuit design, which can result in simulation of the clock network.

For operation 208, a plurality of hash values is generated (e.g., computed or calculated) for the corresponding plurality of enable signals by generating an individual hash value for each individual enable signal in the corresponding plurality of enable signals (generated by operation 206). For some embodiments, the individual hash value for the individual enable signal is generated based on a simulated value, from the plurality of simulated values, for the individual enable signal (e.g., the individual hash value is generated by applying a hash function or operation to the simulated value, to generate a simulation hash value). Additionally, for some embodiments, where operations 204 through 212 are performed for multiple iterations (e.g., such as in method 300 of FIG. 3), the individual hash value for the individual enable signal is generated by combining the hash value of the simulated value for the current iteration and the hash value of the simulated value from a previous iteration (e.g., the last iteration).

Operation 210 determines (e.g., identifies), from the plurality of clock gates, one or more sub-pluralities of clock gates such that each sub-plurality of clock gates includes clock gates that have (e.g., share) a similar hash value (as provided in the plurality of hash values generated by operation 208). For some embodiments, clock gates having different hash values (e.g., simulation hash values) are determined to not have the same enable logic, and thus to not be clones. Accordingly, by way of operations 204 through 210, clock gates that have different hash values and determined to not be clones can be separated (e.g., segregated) for subsequent processing using a sat solver. In general, operation of a sat solver takes more time and/or computing resources than a simulation process used (e.g., by operation 206) to generate simulated values for enable signals.

At operation 212, a satisfiability solver (e.g., one part of a SimSat) is used to attempt to identify at least one vector for the set of inputs that causes enable signals corresponding to at least one sub-plurality of clock gates to have different simulated values. Operation 212 can be performed for each sub-plurality of clock gates determined by operation 210. The at least one vector can represent a variable assignment by the sat solver. By operation 212, some embodiments use the satisfiability solver on clock gates (of an individual sub-plurality) that are indicated to be clones by simulation hash values (generated by operations 206 and 208). By using the sat solver used at operation 212, various embodiments can prove (or disprove) equivalence of enable signals of clock within a given sub-plurality of clock gates. In response to the satisfiability solver identifying the at least one vector (e.g., that at least one vector exists), operation 212 can generate a result that indicates that the enable signals of the at least one sub-plurality of clock gates are not logically equivalent. Alternatively, in response to the satisfiability solver failing to identify the at least one vector (e.g., that at least one vector does not exist), operation 212 can generate a result that indicates that the enable signals of the at least one sub-plurality of clock gates are logically equivalent.

Eventually, at operation 214, clock gate decloning is performed based on a result generated by the using of the satisfiability solver at operation 212. In particular, some embodiments can declone two or more clock gates that are determined to be logically equivalent based on a result of operation 212.

Figure 3:
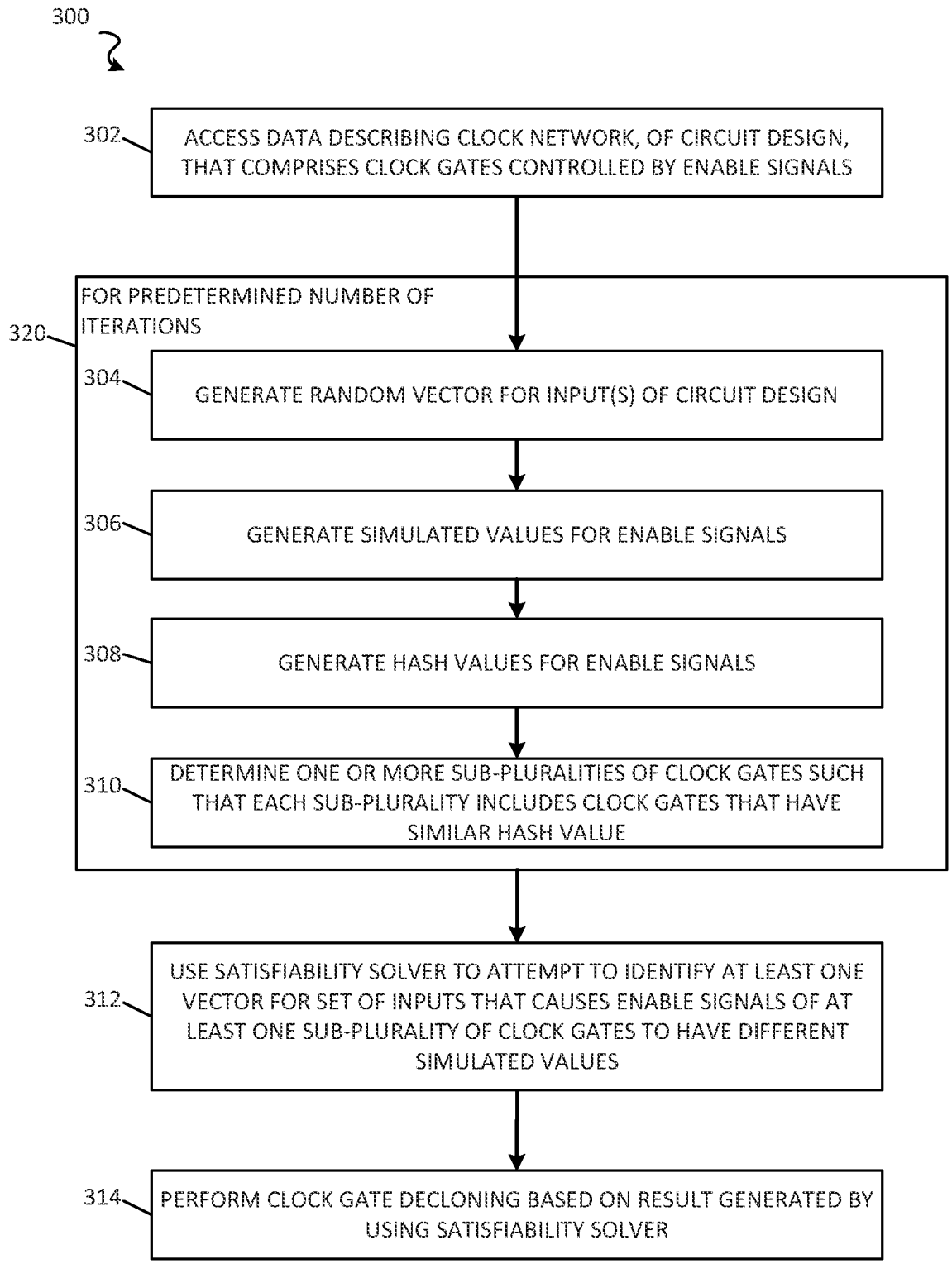

Referring now to FIG. 3, the flowchart illustrates the example method 300 for determining clock gates for decloning based on multiple simulation iterations and a satisfiability solver, according to some embodiments. According to some embodiments, operation 302 is similar to operation 202 of the method 200 described above with respect to FIG. 2.

During operation 320, operations 304 through 310 are performed for a predetermined number of iterations (e.g., N number of iterations). Depending on the embodiment, the predetermined number can be a predetermined or a user-defined value. By operation 320, various embodiments can perform multiple simulation iterations to separate (e.g., segregate) clock gates that are not clones (e.g., that have different simulation hash values) into different sub-pluralities of clock gates. For some embodiments, operations 304, 306, 308, 310 are respectively similar to operations 204, 206, 208, 210 of the method 200 described above with respect to FIG. 2. After operation 320 performs a predetermined number of iterations of operations 304 through 310, at operation 312 a satisfiability solver is used to attempt to identify at least one vector for the set of inputs that causes enable signals corresponding to at least one sub-plurality of clock gates to have different simulated values. Operation 312 can be performed for each sub-plurality of clock gates determined by operation 310. Thereafter, at operation 314, clock gate decloning is performed based on a result generated by the using of the satisfiability solver at operation 312. In particular, some embodiments can declone two or more clock gates that are determined to be logically equivalent based on a result of operation 312.

Figure 4:
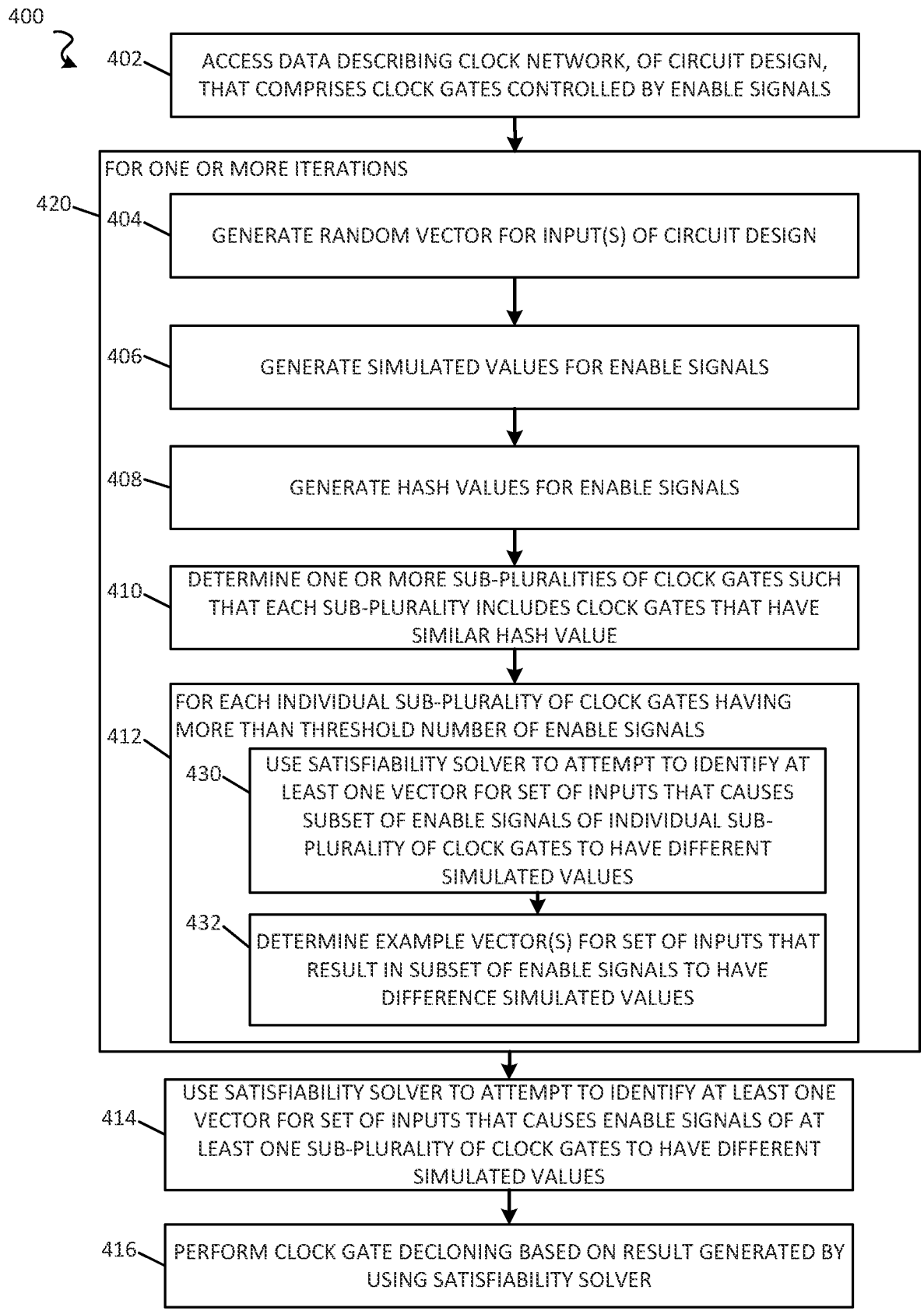

Referring now to FIG. 4, the flowchart illustrates the example method 400 for determining clock gates for decloning based on multiple simulation iterations and multiple iterations of using a satisfiability solver, according to some embodiments. For some embodiments, the method 400 represents an approach with adaptive simulation, which contrasts with the approach of using a predetermined number of simulation iterations (e.g., the method 300 of FIG. 3). The adaptive simulation approach can involve simulating the circuit design while still splitting clock gates into sub-pluralities of clock gates that share enable signals. For some embodiments, the adaptive simulation approach can stop when a sub-plurality of clock gates are small enough, if after several iterations, no sub-plurality of clock gates is further split.

According to some embodiments, operation 402 is similar to operation 202 of the method 200 described above with respect to FIG. 2. During operation 420, operations 404 through 412 are performed for one or more iterations. For some embodiments, operation 420 performs iterations based on satisfaction of a condition. For instance, after operation 412, operation 420 can continue by performing another iteration if a condition regarding iteration number is satisfied (e.g., the number of iterations performed is less than a predetermined number, such as 1000). More regarding example conditions is described with respect to operation 412.

For some embodiments, operations 404, 406, 408, 410 are respectively similar to operations 204, 206, 208, 210 of the method 200 described above with respect to FIG. 2. For each individual sub-plurality of clock gates (of the one or more sub-pluralities of clock gates) determined by operation 410, operation 420 determines whether the individual sub-plurality of clock gates has (e.g., is associated with or involves) more than a threshold number of enable signals (e.g., thirty enable signals). For instance, if a given sub-plurality of clock gates comprises twenty clock gates, then the given sub-plurality of clock gates has at least twenty enable signals. For some embodiments, the threshold number is a predetermined or a user-defined value. If one or more individual sub-pluralities of clock gates have more than the threshold number of enable signals, during operation 412, operations 430 and 432 are performed with respect to each individual sub-plurality of clock gates.

At operation 430, a satisfiability solver is used to attempt to identify at least one vector for the set of inputs that causes a subset of enable signals (of all enable signals) of the individual sub-plurality of clock gates to have different simulated values. For some embodiments, the number of enable signals included in the subset of enable signals is pre-determined or a user-defined value that is less than the threshold number of enable signals (e.g., small number of enable signals). For example, where the threshold number of enable signals comprises thirty enable signals, the subset of enable signals can comprise five pairs of enable signals. By operation 430, various embodiments attempt to prove (or disprove) the logical equivalence of enable signals of the individual sub-plurality of clock gates, but attempt to do so using the subset of enable signals (rather than all of the enable signals) of the individual sub-plurality of clock gates.

Based on the using of the satisfiability solver on the subset of enable signals at operation 430, operation 432 determines (e.g., identifies) one or more example vectors for the set of inputs that result in the subset of enable signals to have different simulated values. For some embodiments, the one or more example vectors represent counterexamples that can be used in a subsequent iteration of operation 420 to prove (or disprove) logical equivalency of enable signals of clock gates in the plurality of clock gates. For instance, if the sat solver determines the subset of enable signals are not logically equivalent, at least one vector used by the sat solver to prove that the subset of enable signals are not logically equivalent can be used as an example vector to be used as a counter example to prove that two or more enable signals are not logically equivalent during a subsequent iteration of operation 420. Additionally, finding (e.g., observing) commonalities between multiple counter examples and finding (e.g., observing) the non-commonalities between multiple counter examples can enable some embodiments to come up with new simulation vectors (that are not uniform random) that have the potential to result in further splitting of a sub-plurality of clock gates during a subsequent iteration of operation 420. For some embodiments, after operation 432, operation 412 can cause the one or more example vectors to be used to perform a next iteration if the next iteration is performed (e.g., next iteration performed based on a condition).

According to some embodiments, operation 432 comprises, for individual vectors identified (at operation 430) by the satisfiability solver that cause the subset of enable signals to have similar simulated values, determining (e.g., identifying) one or more bits that are not common for all of the individual vectors. Based on the determined one or more bits, operation 432 can determine the one or more example vectors. For instance, operation 432 can look for bits that are the same in all counter examples and generate counter example values by keeping common bits and varying only the uncommon bits (e.g., the bit that are different).

After operation 412, operation 420 can determine whether a condition is satisfied to perform another iteration, and in response to the condition being satisfied, can perform another iteration. Depending on the embodiment, the condition can comprise that at least one sub-plurality of clock gates, in the one or more sub-pluralities of clock gates, has a set of enable signals that has more than the threshold number of enable signals (e.g., that at least one sub-plurality of clock gates has thirty or more enable signals). The condition can comprise that less than a threshold number of iterations has already been performed. The condition can comprise that less than a threshold number of iterations has been performed since at least one individual sub-plurality of clock gates has been split.

After operation 420 ends, at operation 414, a satisfiability solver is used to attempt to identify at least one vector for the set of inputs that causes enable signals corresponding to at least one sub-plurality of clock gates (that remains) to have different simulated values. For some embodiments, operation 414 is similar to operation 312 of method 300 described with respect to FIG. 3.

Thereafter, at operation 416, clock gate decloning is performed based on one or more results generated by operation 420, where the one or more results can identify which clock gates have logically equivalent enable clock signals (and thus can be decloned).

Figure 5:
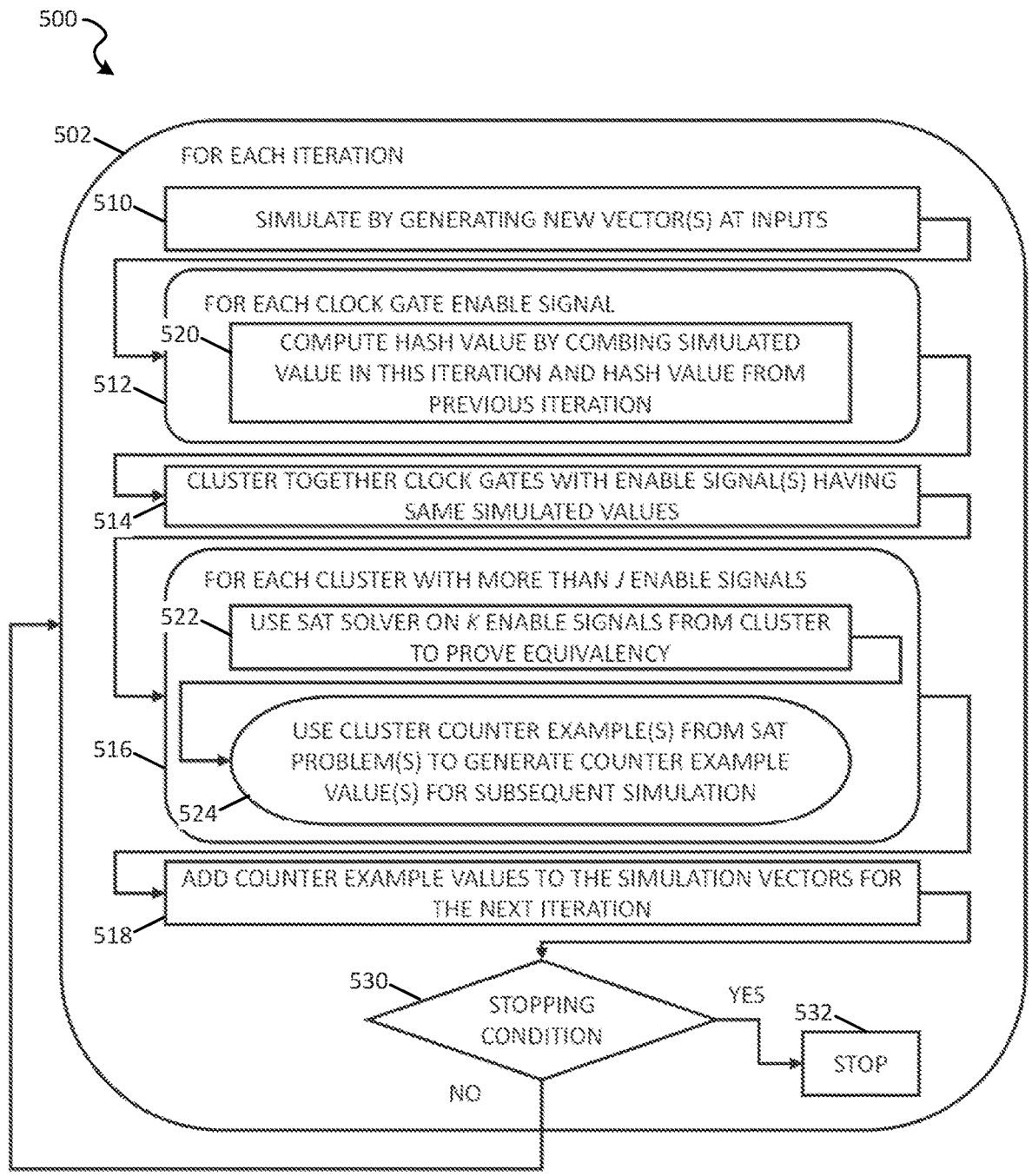

Referring now to FIG. 5, the flowchart illustrates the example method 500 for determining clock gates for decloning based on multiple simulation iterations and multiple iterations of using a satisfiability solver, according to some embodiments. For some embodiments, the method 500 represents a specific implementation of operation 420 of the method 400 described above with respect to FIG. 4.

As shown, operation 502 is performed for one or more iterations, and at each iteration, operations 510 through 530 are performed. At operation 510, one or more enable signals of clock gates are simulated by generating one or more new vectors at inputs of a circuit design. Operation 520 is performed for each clock gate enable signal during operation 512. During operation 520, a hash value for a given enable signal is computed by combining a hash of a simulated value of the given enable signal for the current iteration of operation 502 with the hash of the simulated value of the given enable signal from a previous iteration (e.g., all previous iterations) of operation 502. At operation 514, clock gates with enable signals having a same simulated value (same hash value of the simulated value) are clustered together. Operations 522 and 524 are performed for each cluster of clock gates with more than J enable signals (e.g., J is equal to thirty) during operation 516. During operation 522, a sat solver is used on K enable signals (e.g., K is equal to five) from a given cluster to prove logic equivalency of those K enable signals. Operation 524 uses one or more cluster counter examples from one or more sat solver problems solved by the sat solver (during operation 520) to generate one or more counter example values for a subsequent simulation iteration of operation 502. At operation 518, the one or more counter examples generated by operation 516 are added as part of simulation vectors for the next iteration of operation 502. To determine whether operation 502 will perform the next iteration, at operation 530, it is determined whether a stopping condition is satisfied. If the stopping condition is satisfied, operation 502 stops at operation 532, otherwise, operation 502 performs the next iteration starting with operation 510. Examples of the stopping condition can include, for example, one or more of the following: no cluster of clock gates having more than J enable signals exists; no further splitting of any large clusters of clock gates is occurring (e.g., no splitting of large clusters has occurred for five iterations); or more than L iterations of operation 502 have now been performed (e.g., where L is set to one thousand).

Figure 6:
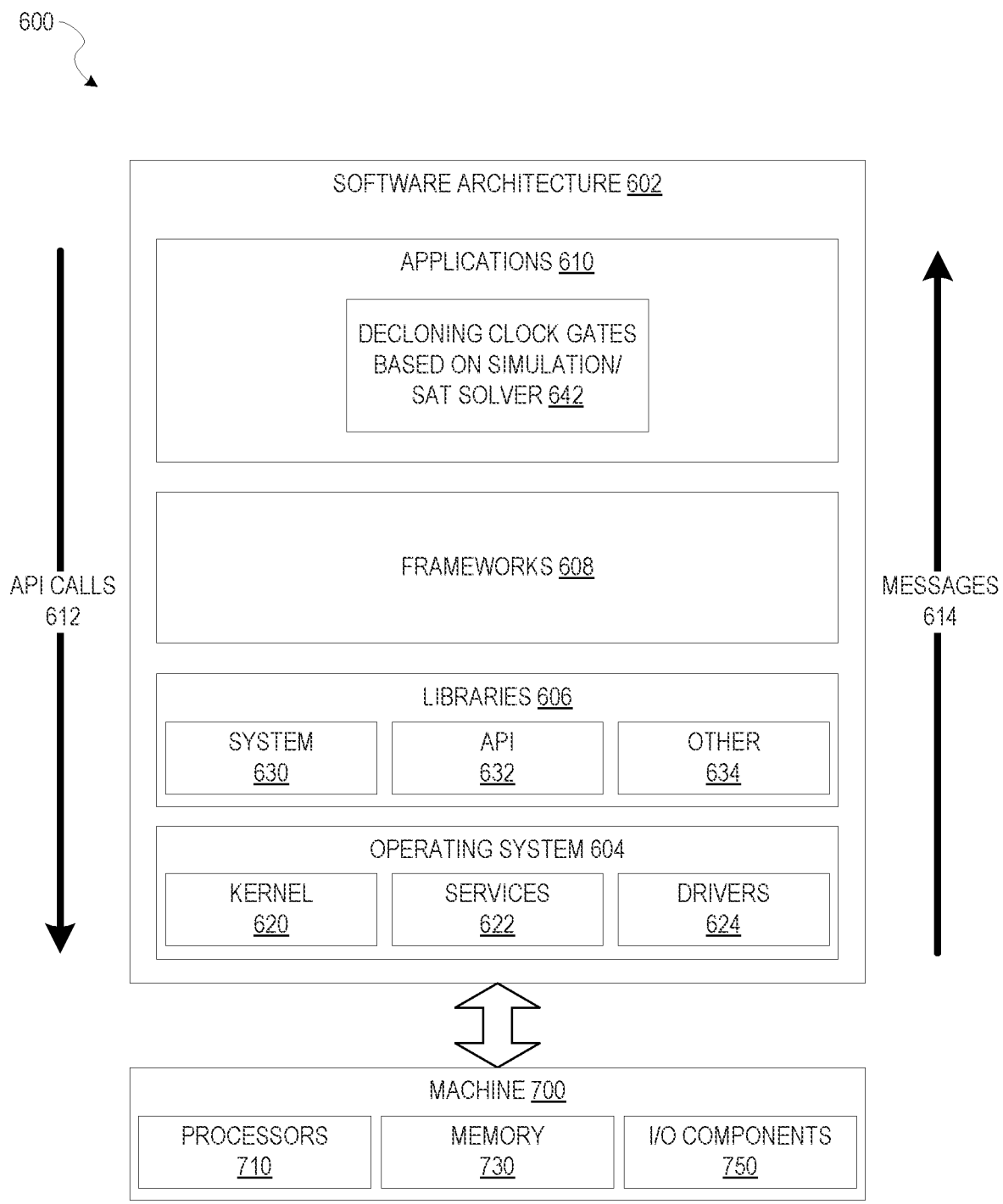
FIG. 6 is a block diagram illustrating an example of a software architecture that may be operating on an electronic design automation (EDA) computing device and may be used with methods for determining clock gates for decloning based on simulation and a satisfiability solver, according to some embodiments.

FIG. 6 is a block diagram 600 illustrating an example of a software architecture 602 that may be operating on an EDA computer and may be used with methods for determining clock gates for decloning based on simulation and a satisfiability solver, according to some example embodiments. The software architecture 602 can be used as an EDA computing device to implement any of the methods described above.

FIG. 6 is merely a non-limiting example of a software architecture 602, and it will be appreciated that many other architectures can be implemented to facilitate the functionality described herein. In various embodiments, the software architecture 602 is implemented by hardware such as a machine 700 of FIG. 7 that includes processors 710 (e.g., hardware processors), memory 730, and I/O components 750. In this example, the software architecture 602 can be conceptualized as a stack of layers where each layer may provide a particular functionality. For example, the software architecture 602 includes layers such as an operating system 604, libraries 606, software frameworks 608, and applications 610. Operationally, the applications 610 invoke application programming interface (API) calls 612 through the software stack and receive messages 614 in response to the API calls 612, consistent with some embodiments. In various embodiments, any client device, any server computer of a server system, or any other device described herein may operate using elements of the software architecture 602. An EDA computing device described herein may additionally be implemented using aspects of the software architecture 602, with the software architecture 602 adapted for determining clock gates for decloning based on simulation and a satisfiability solver in any manner described herein.

In one embodiment, an EDA application of the applications 610 determines clock gates for decloning based on simulation and a satisfiability solver according to embodiments described herein using various modules within the software architecture 602. For example, in one embodiment, an EDA computing device similar to the machine 700 includes the memory 730 and the one or more processors 710. The processors 710 also implement a decloning clock gates based on simulation or sat solver (simulation/sat solver) module 642 for determining clock gates for decloning based on simulation and a satisfiability solver in accordance with various embodiments described herein.

In various other embodiments, rather than being implemented as modules of the one or more applications 610, the decloning clock gates based on simulation/sat solver module 642 may be implemented using elements of the libraries 606, the operating system 604, or the software frameworks 608.

In various implementations, the operating system 604 manages hardware resources and provides common services. The operating system 604 includes, for example, a kernel 620, services 622, and drivers 624. The kernel 620 acts as an abstraction layer between the hardware and the other software layers, consistent with some embodiments. For example, the kernel 620 provides memory management, processor management (e.g., scheduling), component management, networking, and security settings, among other functionality. The services 622 can provide other common services for the other software layers. The drivers 624 are responsible for controlling or interfacing with the underlying hardware, according to some embodiments. For instance, the drivers 624 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 606 provide a low-level common infrastructure utilized by the applications 610. The libraries 606 can include system libraries 630 such as libraries of blocks for use in an EDA environment or other libraries that can provide functions such as memory allocation functions, string manipulation functions, mathematic functions, and the like. In addition, the libraries 606 can include API libraries 632 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 606 may also include other libraries 634.

The software frameworks 608 provide a high-level common infrastructure that can be utilized by the applications 610, according to some embodiments. For example, the software frameworks 608 provide various graphic user interface (GUI) functions, high-level resource management, high-level location services, and so forth. The software frameworks 608 can provide a broad spectrum of other APIs that can be utilized by the applications 610, some of which may be specific to a particular operating system 604 or platform. In various embodiments, the systems, methods, devices, and instructions described herein may use various files, macros, libraries, and other elements of an EDA design environment to implement determination of clock gates for decloning based on simulation and a satisfiability solver as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 602, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 700 including processors 710), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 700, but deployed across a number of machines 700. In some example embodiments, the processors 710 or processor-implemented modules are located in a single geographic location (e.g., within a home environment, an office environment, or a server farm). In other example embodiments, the processors or processor-implemented modules are distributed across a number of geographic locations.

Figure 7:
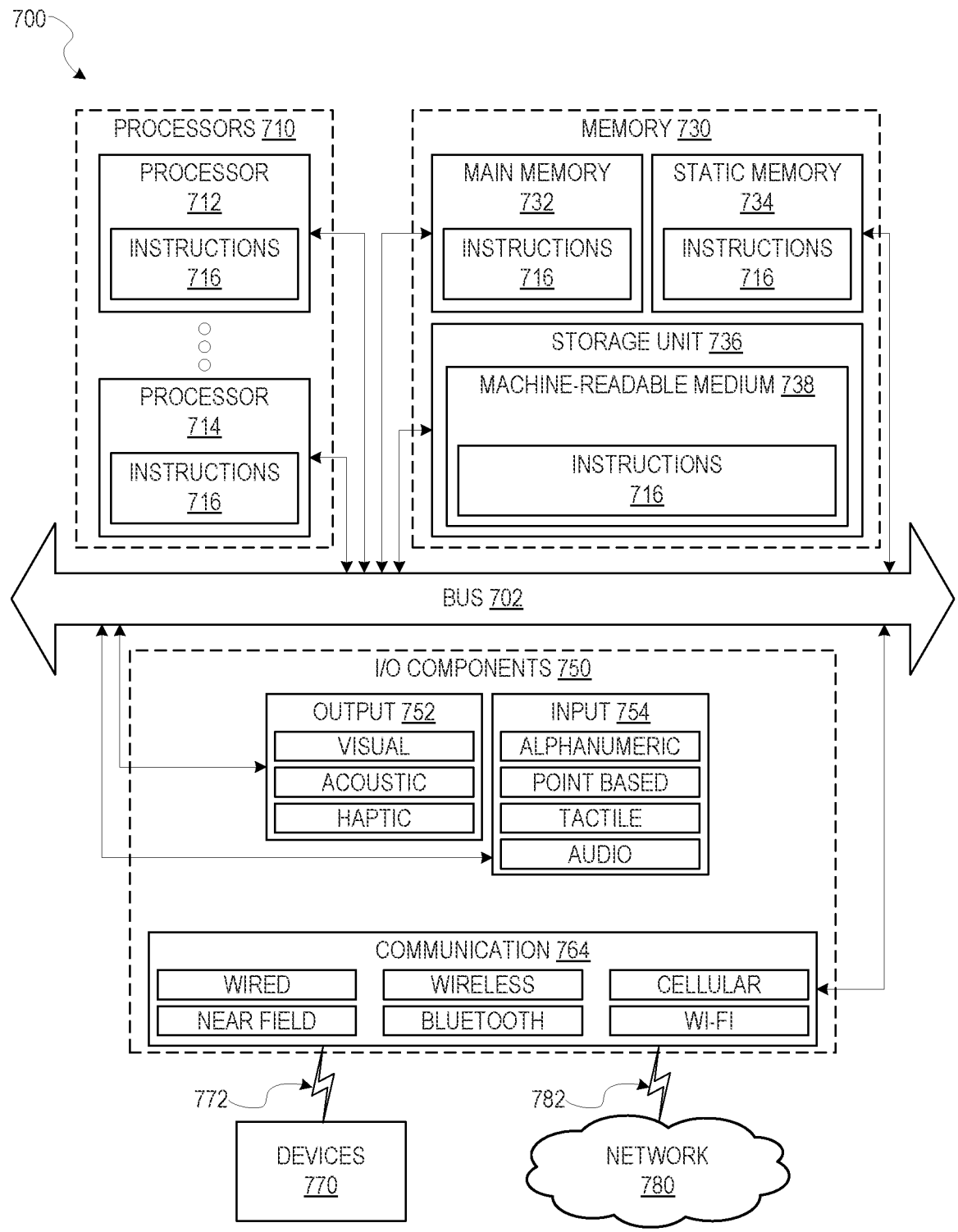
FIG. 7 is a diagram representing a machine in the form of a computer system within which a set of instructions are executed, causing the machine to perform any one or more of the methods discussed herein, according to some example embodiments.

FIG. 7 is a diagrammatic representation of the machine 700 in the form of a computer system within which a set of instructions may be executed for causing the machine 700 to perform any one or more of the methodologies discussed herein, according to an example embodiment. FIG. 7 shows components of the machine 700, which is, according to some embodiments, able to read instructions from a machine-readable medium (e.g., a machine-readable storage medium) and perform any one or more of the methodologies discussed herein. Specifically, FIG. 7 shows a diagrammatic representation of the machine 700 in the example form of a computer system, within which instructions 716 (e.g., software, a program, an application, an applet, an app, or other executable code) for causing the machine 700 to perform any one or more of the methodologies discussed herein can be executed. In alternative embodiments, the machine 700 operates as a standalone device or can be coupled (e.g., networked) to other machines. In a networked deployment, the machine 700 may operate in the capacity of a server machine or a client machine in a server-client network environment, or as a peer machine in a peer-to-peer (or distributed) network environment. The machine 700 can comprise, but not be limited to, a server computer, a client computer, a personal computer (PC), a tablet computer, a laptop computer, a netbook, or any machine capable of executing the instructions 716, sequentially or otherwise, that specify actions to be taken by the machine 700. Further, while only a single machine 700 is illustrated, the term "machine" shall also be taken to include a collection of machines 700 that individually or jointly execute the instructions 716 to perform any one or more of the methodologies discussed herein.

In various embodiments, the machine 700 comprises processors 710, memory 730, and I/O components 750, which can be configured to communicate with each other via a bus 702. In an example embodiment, the processors 710 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 712 and a processor 714 that may execute the instructions 716. The term "processor" is intended to include multi-core processors 710 that may comprise two or more independent processors 712, 714 (also referred to as "cores") that can execute the instructions 716 contemporaneously. Although FIG. 7 shows multiple processors 710, the machine 700 may include a single processor 712 with a single core, a single processor 712 with multiple cores (e.g., a multi-core processor 712), multiple processors 710 with a single core, multiple processors 710 with multiple cores, or any combination thereof.

The memory 730 comprises a main memory 732, a static memory 734, and a storage unit 736 accessible to the processors 710 via the bus 702, according to some embodiments. The storage unit 736 can include a machine-readable medium 738 on which are stored the instructions 716 embodying any one or more of the methodologies or functions described herein. The instructions 716 can also reside, completely or at least partially, within the main memory 732, within the static memory 734, within at least one of the processors 710 (e.g., within the processor's cache memory), or any suitable combination thereof, during execution thereof by the machine 700. Accordingly, in various embodiments, the main memory 732, the static memory 734, and the processors 710 are considered machine-readable media 738.

As used herein, the term "memory" refers to a machine-readable medium 738 able to store data temporarily or permanently and may be taken to include, but not be limited to, random-access memory (RAM), read-only memory (ROM), buffer memory, flash memory, and cache memory. While the machine-readable medium 738 is shown, in an example embodiment, to be a single medium, the term "machine-readable medium" should be taken to include a single medium or multiple media (e.g., a centralized or distributed database, or associated caches and servers) able to store the instructions 716. The term "machine-readable medium" shall also be taken to include any medium, or combination of multiple media, that is capable of storing instructions (e.g., the instructions 716) for execution by a machine (e.g., the machine 700), such that the instructions, when executed by one or more processors of the machine (e.g., the processors 710), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 750 include a wide variety of components to receive input, provide output, produce output, transmit information, exchange information, capture measurements, and so on. In general, it will be appreciated that the I/O components 750 can include many other components that are not shown in FIG. 7. The I/O components 750 are grouped according to functionality merely for simplifying the following discussion, and the grouping is in no way limiting. In various example embodiments, the I/O components 750 include output components 752 and input components 754. The output components 752 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 754 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 750 may include communication components 764 operable to couple the machine 700 to a network 780 or devices 770 via a coupling 782 and a coupling 772, respectively. For example, the communication components 764 include a network interface component or another suitable device to interface with the network 780. In further examples, the communication components 764 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 770 may be another machine or any of a wide variety of peripheral devices (e.g., a peripheral device coupled via a USB).

In various example embodiments, one or more portions of the network 780 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 780 or a portion of the network 780 may include a wireless or cellular network, and the coupling 782 may be a Code Division Multiple Access (CDMA) connection, a Global System for Mobile communications (GSM) connection, or another type of cellular or wireless coupling.

Furthermore, the machine-readable medium 738 is non-transitory (in other words, not having any transitory signals) in that it does not embody a propagating signal. However, labeling the machine-readable medium 738 "non-transitory" should not be construed to mean that the machine-readable medium 738 is incapable of movement; the machine-readable medium 738 should be considered as being transportable from one physical location to another. Additionally, since the machine-readable medium 738 is tangible, the machine-readable medium 738 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform operations comprising:
    accessing data that describes a clock network of a circuit design, the clock network comprising a plurality of clock gates controlled by a corresponding plurality of enable signals; and
    for a predetermined number of iterations:
        generating a random vector for a set of inputs of the circuit design;
        generating a plurality of simulated values for the corresponding plurality of enable signals by simulating operation of the clock network using the random vector;
        generating a plurality of hash values for the corresponding plurality of enable signals by generating an individual hash value for each individual enable signal in the corresponding plurality of enable signals based on a simulated value, for the individual enable signal, from the plurality of simulated values; and
        determining, from the plurality of clock gates, one or more sub-pluralities of clock gates such that each sub-plurality of clock gates includes clock gates that have a similar hash value in the plurality of hash values.

2. The non-transitory computer-readable medium of claim 1, wherein the operations further comprise;
    using a satisfiability solver to attempt to identify at least one vector for the set of inputs that causes enable signals corresponding to at least one sub-plurality of clock gates to have different simulated values.

3. The non-transitory computer-readable medium of claim 2, wherein the operations further comprise:
    in response to the satisfiability solver identifying the at least one vector, generating a result that indicates that the enable signals of the at least one sub-plurality of clock gates are not logically equivalent.

4. The non-transitory computer-readable medium of claim 2, wherein the operations further comprise:
    in response to the satisfiability solver failing to identify the at least one vector, generating a result that indicates that the enable signals of the at least one sub-plurality of clock gates are logically equivalent.

5. The non-transitory computer-readable medium of claim 2, wherein the operations further comprise:
    performing clock gate decloning based on a result generated by the using of the satisfiability solver to identify the at least one vector for the set of inputs that causes enable signals corresponding to the at least one sub-plurality of clock gates to have different simulated values.

6. The non-transitory computer-readable medium of claim 1, wherein the predetermined number is a user-defined value.

7. The non-transitory computer-readable medium of claim 1, wherein the generating of the individual hash value for the individual enable signal is based on the simulated value and a previous hash value generated for the individual enable signal during a previous iteration.

8. A method comprising:
accessing, by a hardware processor, data that describes a clock network of a circuit design, the clock network comprising a plurality of clock gates controlled by a corresponding plurality of enable signals; and
for one or more iterations:
generating, by the hardware processor, a random vector for a set of inputs of the circuit design;
generating, by the hardware processor, a plurality of simulated values for the corresponding plurality of enable signals by simulating operation of the clock network using the random vector;
generating, by the hardware processor, a plurality of hash values for the corresponding plurality of enable signals by generating an individual hash value for each individual enable signal in the corresponding plurality of enable signals based on a simulated value, for the individual enable signal, from the plurality of simulated values;
determining, by the hardware processor and from the plurality of clock gates, one or more sub-pluralities of clock gates such that each sub-plurality of clock gates includes clock gates that have a similar hash value in the plurality of hash values; and
for each individual sub-plurality of clock gates, in the one or more sub-pluralities of clock gates, having a set of enable signals that has more than a threshold number of enable signals, using a satisfiability solver to attempt to identify at least one vector for the set of inputs that causes a subset of enable signals, of the individual set of enable signals, to have different simulated values.

9. The method of claim 8, wherein for the individual sub-plurality of clock gates:
based on the using of the satisfiability solver to attempt to identify the at least one vector for the set of inputs, determining one or more example vectors for the set of inputs that result in the subset of enable signals to have different simulated values.

10. The method of claim 9, wherein for the individual sub-plurality of clock gates:
causing the one or more example vectors to be used to perform a next iteration.

11. The method of claim 9, wherein for the individual sub-plurality of clock gates:
determining whether a condition is satisfied to perform another iteration, the condition being that at least one sub-plurality of clock gates, in the one or more sub-pluralities of clock gates, has a set of enable signals that has more than the threshold number of enable signals; and
in response to the condition being satisfied, performing another iteration.

12. The method of claim 9, wherein for the individual sub-plurality of clock gates:
determining whether a condition is satisfied to perform another iteration, the condition being that less than a threshold number of iterations has already been performed; and
in response to the condition being satisfied, performing another iteration.

13. The method of claim 9, wherein for the individual sub-plurality of clock gates:
determining whether a condition is satisfied to perform another iteration, the condition being that less than a threshold number of iterations has been performed since at least one individual sub-plurality of clock gates has been split; and
in response to the condition being satisfied, performing another iteration.

14. The method of claim 9, wherein the determining of the one or more example vectors for the set of inputs that result in the subset of enable signals to have different simulated values comprises:
for individual vectors identified by the satisfiability solver that cause the subset of enable signals to have similar simulated values, determining one or more bits that are not common for all of the individual vectors; and
determining the one or more example vectors based on the one or more bits.

15. The method of claim 8, wherein the threshold number of enable signals is a user-defined value.

16. The method of claim 8, wherein the subset of enable signals has less than the threshold number of enable signals.

17. The method of claim 8, wherein a number of enable signals, in the subset of enable signals, is a user-defined value.

18. A device comprising:
a memory storing instructions; and
a hardware processor communicatively coupled to the memory and configured by the instructions to perform operations comprising:
accessing data that describes a clock network of a circuit design, the clock network comprising a plurality of clock gates controlled by a corresponding plurality of enable signals;
generating a random vector for a set of inputs of the circuit design;
generating a plurality of simulated values for the corresponding plurality of enable signals by simulating operation of the clock network using the random vector;
generating a plurality of hash values for the corresponding plurality of enable signals by generating an individual hash value for each individual enable signal in the corresponding plurality of enable signals based on a simulated value, for the individual enable signal, from the plurality of simulated values; and
determining, from the plurality of clock gates, one or more sub-pluralities of clock gates such that each sub-plurality of clock gates includes clock gates that have a similar hash value in the plurality of hash values.

19. The device of claim 18, wherein the operations further comprise:
using a satisfiability solver to attempt to identify at least one vector for the set of inputs that causes enable signals corresponding to at least one sub-plurality of clock gates to have different simulated values.

20. The device of claim 19, wherein the operations further comprise:
performing clock gate decloning based on a result generated by the using of the satisfiability solver to identify the at least one vector for the set of inputs that causes enable signals corresponding to the at least one sub-plurality of clock gates to have different simulated values.

* * * * *